United States Patent [19]

Matsuda et al.

[11] 4,208,637
[45] Jun. 17, 1980

[54] TUNABLE OPTICAL DEVICE

[75] Inventors: Akihisa Matsuda, Tokyo; Sigeru Iizima, Koganei, both of Japan

[73] Assignee: Agency of Industrial Science & Technology, Ministry of International Trade & Industry, Tokyo, Japan

[21] Appl. No.: 883,328

[22] Filed: Mar. 3, 1978

[30] Foreign Application Priority Data

Mar. 9, 1977 [JP] Japan .................. 52-24743
Apr. 12, 1977 [JP] Japan .................. 52-40896

[51] Int. Cl.$^2$ .............................................. H01S 3/10
[52] U.S. Cl. ........................ 331/94.5 C; 350/162 R
[58] Field of Search ............. 331/94.5 C, 94.5 H, 331/94.5 D, 94.5 M; 350/162 R

[56] References Cited

U.S. PATENT DOCUMENTS

| | | | |
|---|---|---|---|
| 3,675,157 | 7/1972 | Kaminow et al. | 331/94.5 C |
| 3,791,737 | 2/1974 | Johansson | 350/162 R |
| 3,868,589 | 2/1975 | Wang | 331/94.5 C |
| 3,898,585 | 8/1975 | Heidrich et al. | 331/94.5 C |
| 3,906,393 | 9/1975 | Fletcher | 331/94.5 C |
| 3,970,959 | 7/1976 | Wang et al. | 331/94.5 C |
| 3,972,008 | 7/1976 | Fletcher | 331/94.5 C |
| 4,094,575 | 6/1978 | Kellie | 350/162 R |

OTHER PUBLICATIONS

Kogelnik et al., Stimulated Emission in a Periodic Structure, Appl. Phys. Lett., vol. 18. No. 4 (Feb. 15, 1971) pp. 152-154.
Schinke et al., Thin-film Distributed-Feedback Laser Fabricated by Ion Milling, Appl. Phys. Lett., vol. 21, No. 10 (Nov. 15, 1972) pp. 494-496.

Primary Examiner—William L. Sikes
Attorney, Agent, or Firm—Kurt Kelman

[57] ABSTRACT

A tunable optical device is produced by forming in the surface of a substrate a fan-shaped grating of continuously varying period by means of a holographic technique using a photoresist and twisted mirrors, coating the surface of the substrate containing the formed grating with a polyurethane film and diffusing a dye in the prescribed region of the resultant polyurethane film coated on the substrate. In the device of the construction described above, irradiation of the region having the fan-shaped grating with a laser light generates laser light beams whose wavelength is variable with the position at which the laser light impinges upon the region of the grating.

5 Claims, 13 Drawing Figures

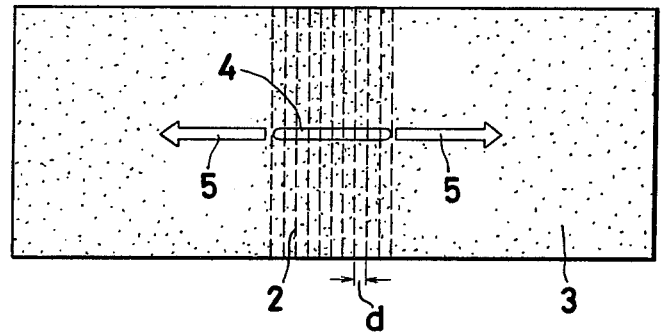
Fig_1(A) Prior Art
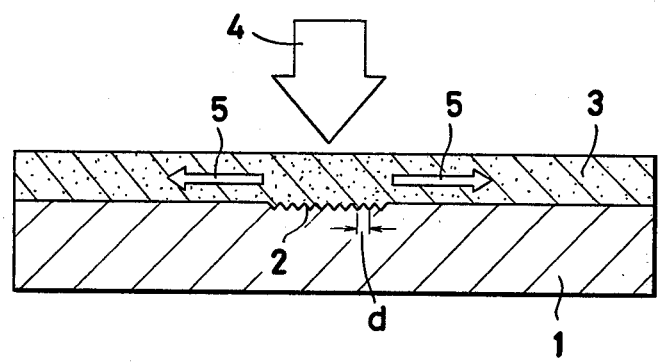
Fig_1(B) Prior Art
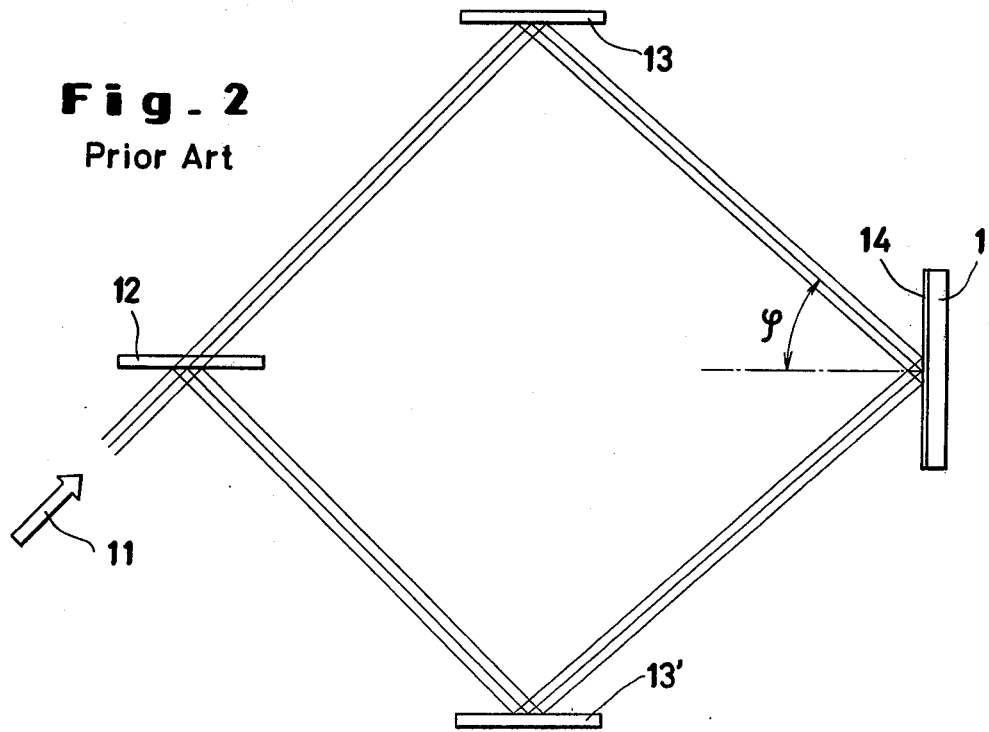
Fig_2 Prior Art

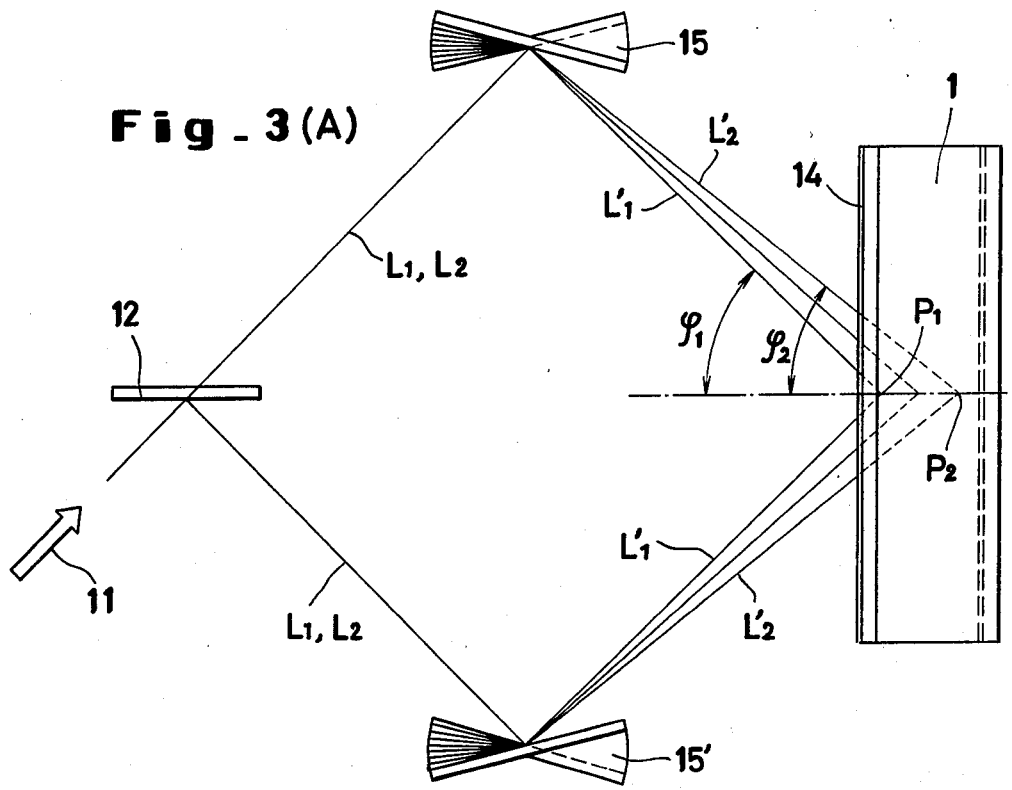
Fig_3(A)
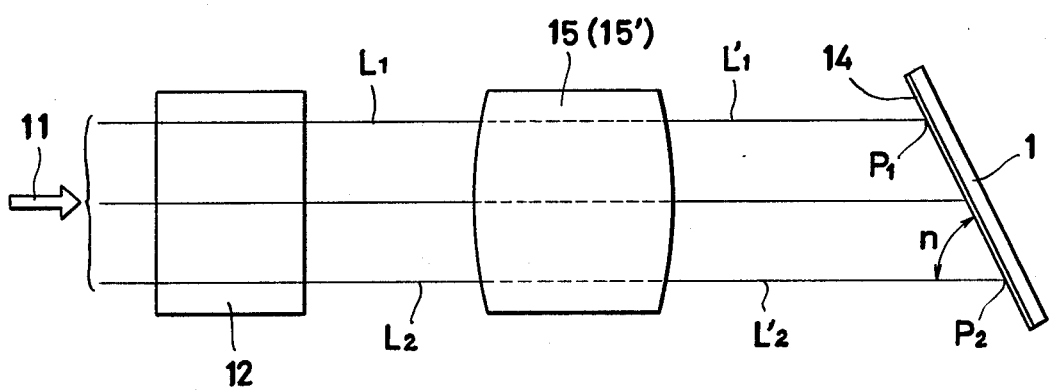
Fig_3(B)

TUNABLE OPTICAL DEVICE

BACKGROUND OF THE INVENTION

This invention relates to a tunable optical device and a method for the manufacture thereof.

There have heretofore been proposed to the art various forms of thin-film dye lasers. For example, those of one construction are known to be formed by disposing rhodamine 6G in gelatin films and exposing the films in periodic patterns to light (Applied Physics Letters, Vol. 8 No. 4, 1972, pp 152-154) and those of another construction are produced by forming gratings of periodic patterns on a fused silica by the ion-milling technique and coating the formed grating with a polyurethane film doped in advance with rhodamine 6G. Both types are known to generate laser beams upon irradiation of the grating with an ultraviolet ray (Applied Physics Letters, Vol. 21 No. 10, 1972, pp 494–496).

These dye lasers of the prior art, however, invariably have a disadvantage that the wavelengths of the generated beams cannot be varied without varying the periods of their gratings or varying the refractive indexes of the thin films used to coat their grating regions.

An object of the present invention is to provide a tunable optical device capable of operating with varying wavelengths of light.

SUMMARY OF THE INVENTION

To accomplish the object described above according to this invention, there is provided an improved optical device comprising a substrate, a grating formed in the surface of the substrate and a thin film of a high molecular substance, glass or semiconductive substance deposited to coat the surface of the substrate containing the formed grating, the improvement being that the grating is formed to be a fan-shaped grating the period of which varies continuously.

In the optical device of the construction described above when a dye is diffused in the portion of the film overlying the grating region, the laser beams generated upon irradiation of the grating region with a laser beam can be varied in wavelength simply by shifting the position at which the laser beam impinges upon the grating region. Thus, the optical device can be used to provide a tunable dye laser. Further, when a given light is caused to impinge upon this optical device, as an optical waveguide, the light is reflected by the particular portion of the grating which has a period conforming with the wavelength of the incident light. The optical device, therefore, serves as an optical filter possessing a broad filter zone.

The fan-shaped grating with the continuously varying period as described above is formed in the surface of the substrate by means of a holographic technique using a photoresist and twisted mirrors, followed by reactive plasma etching.

The other objects and characteristics of the present invention will become apparent from the description of the invention to be given in further detail hereinafter with reference to the accompanying drawing.

BRIEF EXPLANATION OF THE DRAWING

FIG. 1(A) is a plan view illustrating a high molecular thin-film dye laser of the prior art.

FIG. 1(B) is a cross sectional view of the dye laser of FIG. 1(A).

FIG. 2 is an explanatory view illustrating a typical method for the formation of the grating in the dye laser of FIG. 1.

FIG. 3 is an explanatory view illustrating one embodiment of the method for the formation of the grating in the optical device according to the present invention.

DETAILED DESCRIPTION OF THE PREFERRED EMBODIMENT

Figure 4:
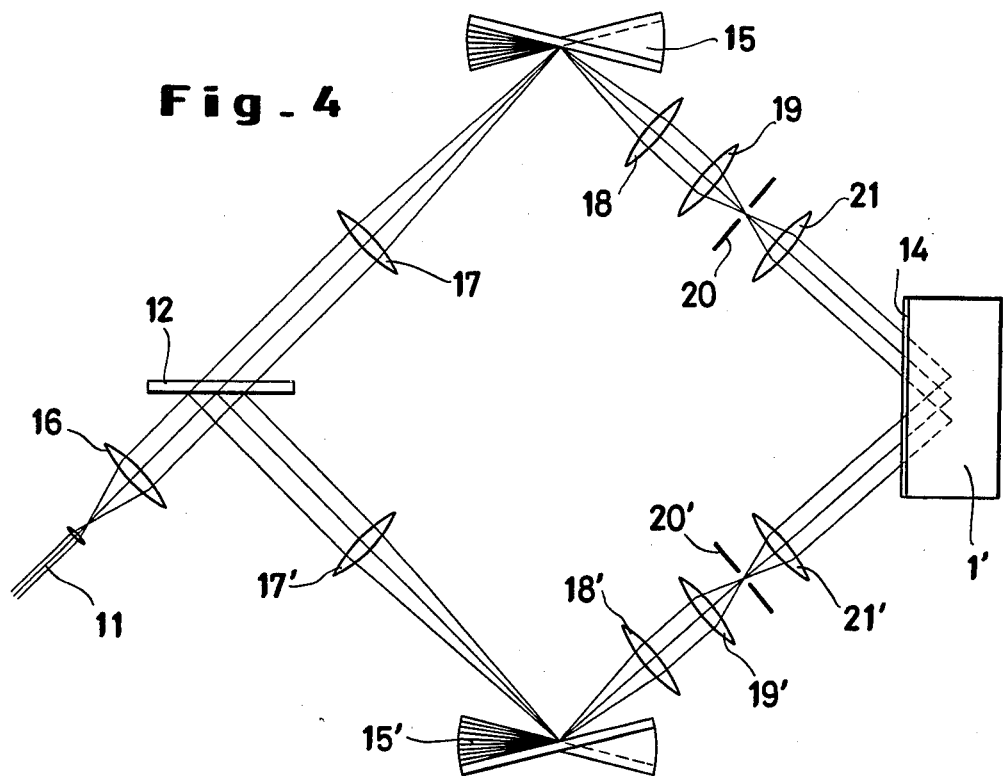
FIG. 4 is an explanatory view illustrating another embodiment of the method for the formation of the grating in the optical device according to the present invention.

FIG. 1 depicts a high molecular thin-film dye laser of the prior art, which is obtained by forming in part of the surface of a substrate 1 a grating 2 consisting of a multiplicity of parallel corrugations spaced by a fixed distance "d" conforming with the wavelength of the light designed to be handled and thereafter coating the whole surface of the substrate containing the formed grating with a thin film 3 of a high molecular substance incorporating therein a dye. The dye laser of the construction described above generates laser beams 5 upon irradiation of the region of the formed grating with a laser beam 4.

FIG. 2 depicts a typical method for forming the grating on the dye laser of a thin film of high molecular substance of FIG. 1 by using a photosensitive resin and an etching technique. In FIG. 2, a laser beam 11 possessing a wavelength proper for exposing the photosensitive resin to be used for coating a substrate is divided by a half mirror 12 into two beams and the two laser beams thus produced are reflected by an opposed pair of mirrors 13, 13' so as to be focused on the surface of a substrate coated with the photosensitive resin 14.

In this case, with a view to enhancing the uniformity of the grating to be formed, it is customary to have a beam expander, a biconvex lens and a pinhole disposed at suitable positions in the light paths. These auxiliary means are not shown in FIG. 2. The interference fringes printed on the photosensitive resin 14 are spaced by a period "d", which is expressed by the following equation.

$$d = \lambda_0 / 2\sin\psi$$

wherein, $\lambda_0$ denotes the wavelength of the laser light 11 in use and $\psi$ the angle of incidence of the laser beam. A grating having a multiplicity of corrugations spaced by a fixed period "d" is produced on the substrate 1 by developing the photosensitive resin 14 which has been exposed to the incident laser beams, subjecting the substrate 1 coated with the developed photosensitive resin 14 to an etching treatment by a known method and subsequently removing the remaining portion of photosensitive resin 14 with a suitable solvent.

In the conventional high molecular thin-film dye laser of the construction described above, since the corrugations of the grating 2 are spaced by a fixed period "d", the wavelength of the laser beams generated by the irradiation of the grating with the laser beam as shown in FIG. 1 is constant, no matter which position the laser beam 4 may impinge upon the grating 2. Thus, it has not been possible to produce any variation in the wavelength of the laser beams generated by one and the same dye laser of the prior art.

This invention aims to provide an optical device which has the corrugations of the grating spaced at a continuously varying period and which, therefore, is capable of operating with incident beams of varying wavelengths. Now, the present invention will be described below as being applied to a high molecular thin-film dye laser operable with varying wavelength.

Figure 5A:
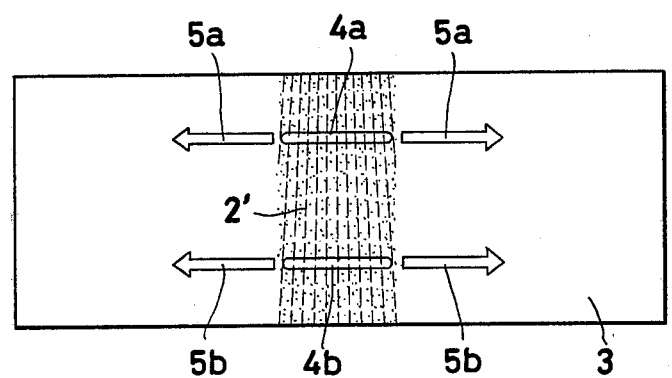
FIG. 5(A) is a plan view illustrating one embodiment of the tunable optical device according to the present invention.

FIGS. 3(A) and 3(B) illustrate one embodiment of the method for producing the grating of an optical device capable of continuous variation of wavelength according to the present invention. This method differs from the method of the prior art illustrated in FIG. 2 in respect that it uses an opposed pair of twisted mirrors 15, 15' instead of an opposed pair of flat mirrors 13, 13'. The pair of twisted mirrors 15, 15' have their reflecting surfaces twisted at one fixed pitch in mutually opposite directions. The substrate 1 having the photosensitive resin 14 deposited thereon is disposed at a proper angle "n" determined relative to the pitch of the twist in the twisted mirrors as illustrated in FIG. 3(B). In this arrangement, the laser beam 11 is first divided by a half mirror 12 into two laser beams and a part of each of the two laser beams advances along a light path $L_1$. On reaching the twisted mirrors 15, 15', these parts of the laser beams are reflected and advance along the light paths $L'_1$ and are focused at the point $P_1$ in the photosensitive resin 14 overlying the substrate 1. Another part of each of the divided beams formed from the laser beam 11 advances along the light path $L_2$ and is similarly reflected by the twisted mirror. Upon reaching the twisted mirrors 15, 15', these parts of the laser beams advance along the light paths $L'_2$ and are finally focused at the point $P_2$ in the photosensitive resin 14. It is clear from FIG. 3(A) that the angle of incidence $\psi_1$ of the laser beam at the position $P_1$ is greater than the angle of incidence $\psi_2$ at the position $P_2$. It follows that the period of the interference fringes printed on the photoresist at the position $P_1$ is smaller than that of the interference fringes printed at the position $P_2$. The substrate 1 having formed in the surface thereof a fan-shaped grating 2' consisting of corrugations of a continuously varying period as illustrated in FIG. 5(A) can be produced by developing the photosensitive resin 14 and subsequently etching the substrate 1 using the photosensitive resin 14 as a mask.

The ratio of the variation in the period of the grating, i.e. the magnitude of the variation in the period of the grating between one end and the other increases with the increasing pitch of twisting in the twisted mirrors. Inclination angle "n" of the resin film is determined by the pitch of the twisting in the twisted mirrors for the focusing of two beams just onto the surface of the resin film. The ratio of the variation in the period of the grating may be suitably selected to meet best the purpose for which the optical device will be used.

Figure 5B:
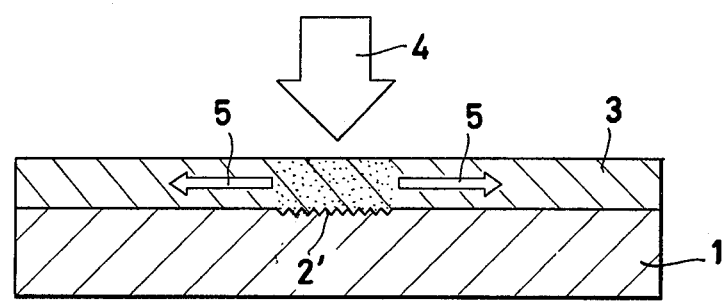
FIG. 5(B) is a cross sectional view of the device of FIG. 5(A).

In the embodiment illustrated in FIGS. 3(A) and 3(B), only those optical elements which are indispensable for the purpose of the operation are shown to facilitate the understanding of the present invention. To obtain a grating 2' of continuously varying period over a greater surface area with added accuracy, there may be used an arrangement like the one illustrated in FIG. 4, wherein a laser beam 11 is converted through the medium of a beam expander 16 into parallel laser beams and the parallel beams are divided by a half mirror 12 into two laser beams, which are respectively converged through cylindrical lenses 17, 17' toward the twisted axes of the twisted mirrors 15, 15'. The laser beams reflected divergently by the twisted mirrors are again converted through cylindrical lenses 18, 18' into parallel laser beams, then converged by biconvex lenses 19, 19' into points, passed through pinholes 20, again converted into parallel beams through the medium of biconvex lenses 21, 21' and finally focused on the photosensitive resin 14. In this manner, a fan-shaped grating of continuously varying period can easily be obtained over a large surface area as illustrated in FIG. 5.

From the substrate on which the grating has been formed as described above, a tunable optical device can easily be produced by coating the surface of the substrate containing the grating with a thin film of a high molecular substance containing a dye by the known method. In case where a dye is diffused in the entire region of the high molecular film, it absorbs light. That is to say, since this dye-diffusion process gives rise to considerably high optical absorption loss, it is not preferable. Desired diffusion of a dye in the limited portion of the high molecular film which directly overlies the grating is accomplished by applying the dye dissolved in an organic solvent to the surface of the portion of the high molecular film in which the dye is expected to be diffused and thereafter heating the portion at a suitable temperature for causing the dye in the solvent to pass diffusingly into the high molecular film. The concentration in which the dye is permitted to diffuse into the high molecular film can be controlled by suitably selecting the length of this heat treatment and the temperature at which the treatment is performed.

By having the dye diffused only in the limited region as described above, the device's possible loss of light due to absorption can be minimized.

Use of the optical device described above as a dye laser will be described with reference to FIG. 5. When a laser beam 4 is caused to impinge upon the grating 2' at a position 4a, there is consequently generated laser beams 5a having a wavelength of $\lambda_1$. When the same laser beam 4 impinges at another position 4b, there are generated laser beams 5b having a different wavelength of $\lambda_2$. The period of the corrugations of the grating increases from the upper to the lower side of the device relative to the position illustrated. Because of the difference in the period, the wavelength $\lambda_2$ of the laser beams generated at the position 4b is greater than the wavelength $\lambda_1$ of the laser beams generated at the position 4a. With this optical device, therefore, the wavelength of the laser beam generated by this optical device can easily be varied by shifting the position at which the laser beam is caused to impinge upon the grating region of the device.

Now, one embodiment of the present invention will be described. A fan-shaped interference pattern was formed over an area 10 mm in width and about 20 mm in lenght on the surface of a fused silica glass substrate coated in advance with a photoresist, by using a He-Cd laser and twisted mirrors as illustrated in FIG. 4. The photoresist was developed. With the developed photoresist as a mask, the fan-shaped grating was duplicated in the form of corrugations in the surface of the glass substrate by the ordinary plasma etching method. The period with which the corrugations were spaced in the grating thus formed on the glass substrate was 1950 Å at one end and 2020 Å at the other end. The grating thus produced on the glass substrate had a pattern such that the period of the corrugations was gradually varied from one end part to the other end part of the grating. The surface of the glass substrate in which the grating had been produced as described above was coated with polyurethane deposited to a thickness of 1 μm as a high molecular thin film. Then, a solution of rhodamine 6G as a dye in ethanol was applied to the portion of the polyurethane film immediately overlying the region of the fan-shaped grating produced on the substrate. Thereafter, the polyurethane film was maintained at a temperature of about 80° C. for one hour, with the result that the rhodamine 6G was caused to pass into the polyurethane film. The film was washed to remove the residual dye. Consequently, there was produced an active region in the polyurethane film as a waveguide.

Figure 6A:
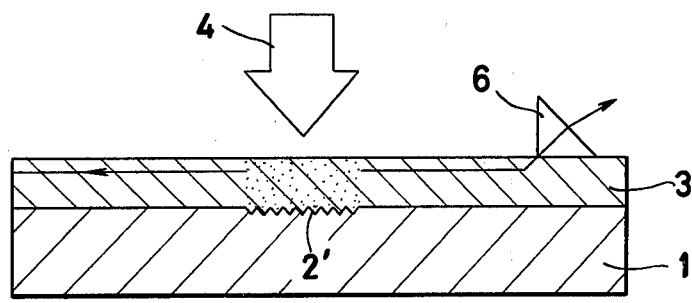
FIG. 6 is an explanatory view illustrating one example wherein the device of the present invention is used as a dye laser.
Figure 6B:
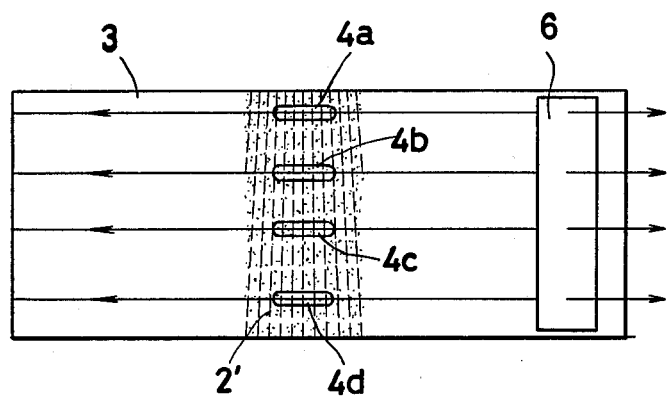
Figure 7:
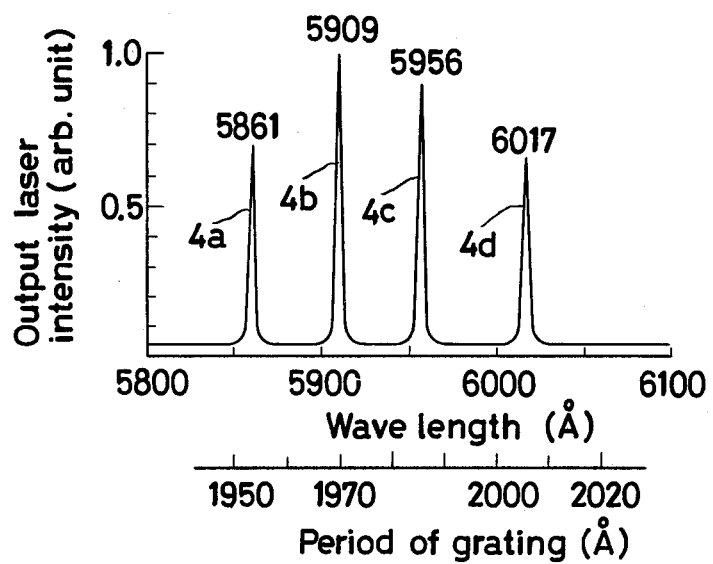
FIG. 7 is a graph showing the wavelength of the laser beams generated by the device of this invention used as a dye laser.

The fan-shaped grating produced as described above was irradiated with a laser beam by the medium of a $N_2$ laser (50 KW). This irradiation was made at four different points in the region of the grating as illustrated in FIGS. 6(A) and 6(B) and the laser beams consequently generated were waveguided out of the polyurethane film through a prism coupler 6 and were analyzed by an optical multi-channel analyzer (not illustrated). The results are shown graphically in FIG. 7. In the graph of FIG. 7, the horizontal axis is graduated in the upper area for wavelength (Å) of the laser beam generated and in the lower area for period of grating and the vertical axis is graduated for intensity of the laser beam generated.

It is seen from FIG. 7 that the irradiation of the grating region with the laser beam at the position 4a [FIG. 6(B)] generates a laser beam having a wavelength of 5861 Å and the grating at this position is estimated to have a period of about 1952 Å, that the irradiation at the position 4b generates a laser beam having a wavelength of 5909 Å and that the irradiation at the position 4d generates a laser beam having a wavelength of 6017 Å and the grating at this position is estimated to have a period of about 2008 Å. Thus, the wavelength of the laser beam generated by the optical device is varied simply by shifting the position at which the incident laser light is allowed to impinge upon the grating region.

The preceding embodiment represents a case wherein the high molecular thin-film optical device of this invention possessing a grating of continuously varying period is used as a dye laser. Alternatively, by providing similar fan-shaped gratings for glass thin film devices or semiconductor optical devices, there can be obtained optical devices of varying functions.

Figure 8:
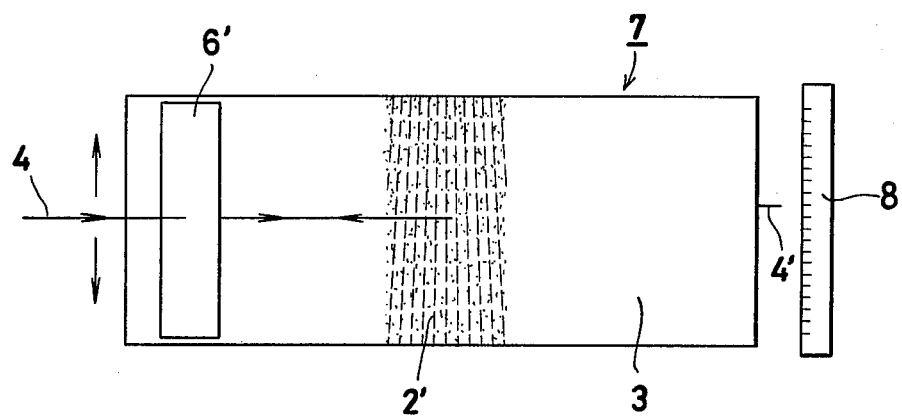
FIG. 8 is an explanatory view illustrating one example wherein the optical device of the present invention is used as a spectroscope.
Figure 9:
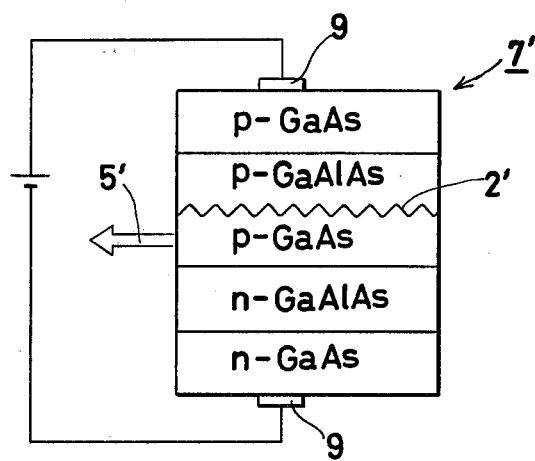
FIG. 9 is an explanatory view illustrating one example wherein the optical device of the present invention is used as a light source device.

For example, when a high molecular thin-film optical device 7 is provided with a grating 2' of continuously varying period as shown in FIG. 8 and a laser beam 4 is waveguided into the film 3 through a prism coupler 6', the light 4' is output at the very position at which the wavelength of the incident light conforms with the period of the grating 2'. Since the position at which the light is output can be read out by a scale 8, the device shown in FIG. 8 may be used as a spectroscope. In the case of a semiconductor photoelectric device, by providing the fan-shaped grating 2' of the present invention instead of an ordinary grating within a GaAs double hetero laser 7' as shown in FIG. 9, arranging in a row a plurality of electrodes 9 above the fan-shaped grating according to IC techniques and applying an electric current to the electrodes, there gives rise to a light source composed of laser beams 5' having different wavelengths.

As described in detail above, the present invention is directed to forming gratings of continuously varying periods on high molecular thin-film optical devices, glass thin-film devices or semiconductor optical devices. Because of the continuous variation in the period of grating, these devices permit the wavelengths of the lights generated thereby to be continuously varied or enable only lights whose wavelengths fall in specified ranges to be passed or taken out. Thus the present invention finds extensive utility not merely as dye lasers but also as light sources for multiplex telecommunications and tunable optical filters.

Since this invention relies for formation of such gratings of continuously varying period upon use of an opposed pair of twisted mirrors, desired production of gratings having the periods of their corrugations continuously varied can be accomplished accurately and easily.

What is claimed is:

1. A method for the manufacture of a tunable optical device, which comprises
    (a) dividing a laser beam into two laser beams so that the divided laser beams advance and impinge upon an opposed pair of twisted mirrors, said twisted mirrors being twisted at a fixed pitch in mutually opposite directions,
    (b) causing the laser beams reflected by said twisted mirrors to be focused on a photosensitive resin layer formed on the surface of a substrate oriented to form an angle with said laser beams impinging thereon,
    (c) developing the photosensitive resin layer thus exposed to the reflected laser beams for thereby producing a mask on the substrate,
    (d) subjecting the substrate to plasma etching through the medium of said mask for thereby forming on said substrate a grating of a multiplicity of corrugations whose period is continuously varied, and
    (e) coating the surface of the substrate containing the formed grating with a film selected from the group consisting of a high molecular thin film, a glass thin film and a semiconductor film.

2. The method for the manufacture of a tunable optical device according to claim 1, which further comprises applying the solution of a dye in an organic solvent to the portion of the film immediately overlying the region of said grating formed on the substrate and maintaining the film at a temperature of about 80° C. for one hour for thereby allowing the dye to diffuse into the portion of the film.

3. A tunable optical device comprising a substrate having a surface, a fan-shaped grating formed in the surface of the substrate, the grating having two ends and consisting of a multiplicity of corrugations of a continuously variable period from one end of the grating to the other end thereof, and a high molecular thin film coating the surface of the substrate, a dye being diffused in a portion of the thin film immediately overlying the grating.

4. The tunable optical device of claim 3, further comprising means for irradiating the grating with a laser beam.

5. The tunable device of claim 2, further comprising means for moving the laser beam from the one grating end to the other end thereof.

* * * * *